(12) United States Patent
Jang et al.

(10) Patent No.: US 11,108,229 B2
(45) Date of Patent: Aug. 31, 2021

(54) ELECTROSTATIC DISCHARGE (ESD) PROTECTION CIRCUIT AND INTEGRATED CIRCUIT INCLUDING THE SAME

(71) Applicant: SAMSUNG ELECTRONICS CO., LTD., Suwon-si (KR)

(72) Inventors: Sung-Pil Jang, Suwon-si (KR); Chang-Su Kim, Hwaseong-si (KR); Han-Gu Kim, Seongnam-si (KR); Moon-Seok Yang, Hwaseong-si (KR); Kyoung-Ki Jeon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 329 days.

(21) Appl. No.: 16/038,744

(22) Filed: Jul. 18, 2018

(65) Prior Publication Data
US 2019/0173278 A1  Jun. 6, 2019

(30) Foreign Application Priority Data

Dec. 5, 2017  (KR) ........................ 10-2017-0166249

(51) Int. Cl.
| | |
|---|---|
| *H02H 9/04* | (2006.01) |
| *H01L 27/02* | (2006.01) |
| *H01L 29/872* | (2006.01) |
| *H01L 29/06* | (2006.01) |

(52) U.S. Cl.
CPC ......... *H02H 9/046* (2013.01); *H01L 27/0266* (2013.01); *H01L 27/0285* (2013.01); *H01L 27/0255* (2013.01); *H01L 29/0619* (2013.01); *H01L 29/872* (2013.01)

(58) Field of Classification Search
CPC . H02H 9/046; H01L 27/0266; H01L 27/0285; H01L 27/0255; H01L 29/0619; H01L 29/872

See application file for complete search history.

(56) References Cited

U.S. PATENT DOCUMENTS

| | | | |
|---|---|---|---|
| 6,002,568 | A | 12/1999 | Ker et al. |
| 7,209,332 | B2 | 4/2007 | Stockinger et al. |
| 7,242,561 | B2 | 7/2007 | Ker et al. |
| 8,400,742 | B2 | 3/2013 | Lai et al. |
| 10,177,137 | B1* | 1/2019 | Altolaguirre ....... H01L 27/0255 |
| 2008/0291709 | A1* | 11/2008 | Kawasaki ............... H02M 1/36 363/77 |
| 2010/0027173 | A1 | 2/2010 | Wijmeersch |
| 2011/0102246 | A1* | 5/2011 | Moulton ................. G01S 7/032 342/159 |

(Continued)

*Primary Examiner* — Kyle J Moody
*Assistant Examiner* — Lakaisha Jackson
(74) *Attorney, Agent, or Firm* — Sughrue Mion, PLLC

(57) ABSTRACT

An electrostatic discharge (ESD) protection circuit is provided. The ESD protection circuit includes a transient-state detection circuit configured to generate a dynamic triggering signal based on a voltage change rate of a voltage on a first power rail; a voltage detection circuit configured to generate a static triggering signal based on the voltage on the first power rail; a trigger circuit configured to generate a discharge control signal based on the dynamic triggering signal and the static triggering signal; and a main discharge circuit configured to discharge an electric charge from the first power rail to a second power rail based on the discharge control signal.

20 Claims, 17 Drawing Sheets

(56) References Cited

U.S. PATENT DOCUMENTS

| | | |
|---|---|---|
| 2012/0120531 A1 | 5/2012 | Abou-Khalil et al. |
| 2016/0087429 A1 | 3/2016 | Wang et al. |
| 2016/0149403 A1* | 5/2016 | Ikeda .................. H05K 1/0259 |
| | | 361/56 |
| 2016/0268798 A1* | 9/2016 | Haruki .................. H02H 9/046 |
| 2016/0352098 A1* | 12/2016 | Chaudhry .............. H02H 9/046 |
| 2017/0221879 A1* | 8/2017 | Wang ................. H01L 27/0285 |

\* cited by examiner

ELECTROSTATIC DISCHARGE (ESD) PROTECTION CIRCUIT AND INTEGRATED CIRCUIT INCLUDING THE SAME

CROSS-REFERENCE TO RELATED APPLICATION

This application claims priority under 35 USC § 119 from Korean Patent Application No. 10-2017-0166249, filed on Dec. 5, 2017 in the Korean Intellectual Property Office (KIPO), the disclosure of which is incorporated herein by reference in its entirety.

BACKGROUND

1. Field

Methods and apparatuses consistent with example embodiments relate generally to semiconductor integrated circuits, and more particularly to an electrostatic discharge (ESD) protection circuit and an integrated circuit including an ESD protection circuit.

2. Related Art

Electronic devices such as mobile devices include various semiconductor integrated circuits. As the semiconductor integrated circuits are scaled down, enhanced electrostatic discharge (ESD) protection becomes increasingly important for the semiconductor integrated circuits. An ESD protection circuit may be used to protect a semiconductor chip or a circuit against harm related to a discharging phenomenon caused by static electricity. For example, due to static electricity, a voltage that is higher than a given breakdown voltage of a circuit may be applied between separate portions of the circuit. In this case, the circuit may be damaged by a large current caused by such a high electrostatic voltage. For example, in a semiconductor device that includes metal-oxide-semiconductor (MOS) transistors, if the high electrostatic voltage is instantaneously applied to an input/output (I/O) pad connected to an input or output circuit, a gate insulating layer of the MOS transistor may be damaged or broken by the high electrostatic voltage.

SUMMARY

Example embodiments provide an Electrostatic discharge (ESD) protection circuit and an integrated circuit including the ESD protection circuit capable of discharging an electric charge by an ESD event efficiently.

According to an aspect of an example embodiment, there is provided an electrostatic discharge protection circuit (an ESD protection circuit) including: a transient-state detection circuit configured to generate a dynamic triggering signal based on a voltage change rate of a voltage on a first power rail; a voltage detection circuit configured to generate a static triggering signal based on the voltage on the first power rail; a trigger circuit configured to generate a discharge control signal based on the dynamic triggering signal and the static triggering signal; and a main discharge circuit configured to discharge an electric charge from the first power rail to a second power rail based on the discharge control signal.

According to an aspect of another example embodiment, there is provided an electrostatic discharge protection circuit (an ESD protection circuit) including: a transient-state detection circuit connected between a first power rail and a second power rail, the transient-state detection circuit being configured to activate a dynamic triggering signal when a voltage change rate of a voltage on the first power rail is higher than a reference rate; a voltage detection circuit connected between the first power rail and the second power rail, the voltage detection circuit being configured to activate a static triggering signal when the voltage on the first power rail is higher than a reference voltage; a trigger circuit connected between the first power rail and the second power rail, the trigger circuit being configured to activate a discharge control signal when both of the dynamic triggering signal and the static triggering signal are activated; and a main discharge circuit connected between the first power rail and the second power rail, the main discharge circuit being configured to discharge an electric charge from the first power rail to the second power rail in response to the discharge control signal being activated.

According to an aspect of yet another example embodiment, there is provided an integrated circuit including: an internal circuit connected between a first power rail and a second power rail; and an electrostatic discharge protection circuit (an ESD protection circuit) connected between the first power rail and the second power rail, the ESD protection circuit being configured to discharge an electric charge from the first power rail to the second power rail when a voltage change rate of a voltage on the first power rail is higher than a reference rate and the voltage on the first power rail is higher than a reference voltage.

BRIEF DESCRIPTION OF THE DRAWINGS

Example embodiments of the present disclosure will be more clearly understood from the following detailed description taken in conjunction with the accompanying drawings.

DETAILED DESCRIPTION

Figure 1:
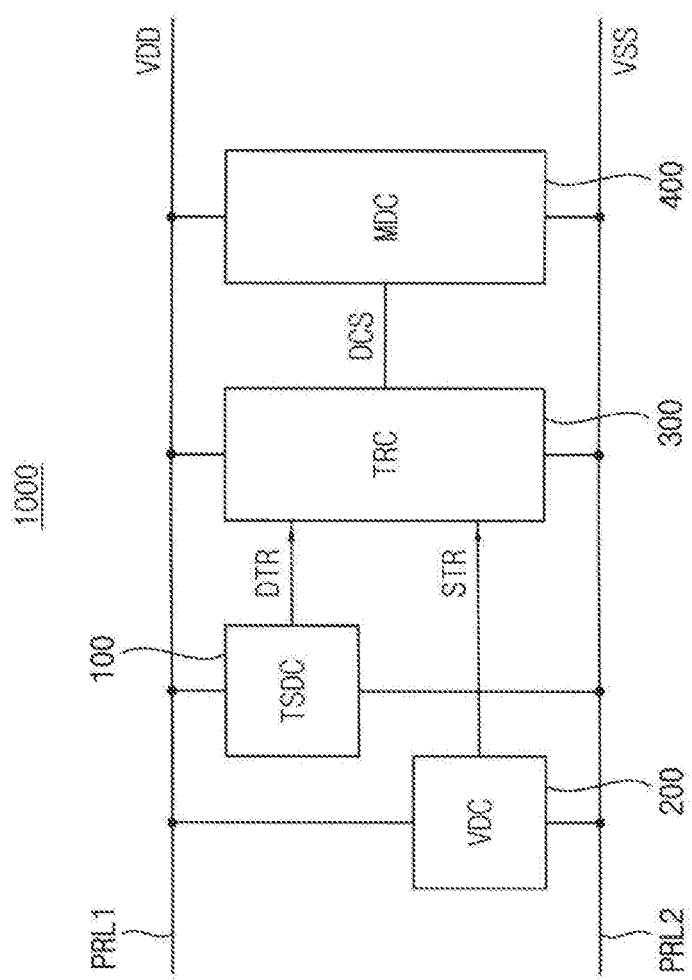
FIG. 1 is a block diagram illustrating an electrostatic discharge (ESD) protection circuit according to example embodiments.

Various example embodiments will be described more fully hereinafter with reference to the accompanying drawings, in which aspects of example embodiments are shown. In the drawings, like numerals refer to like elements throughout. Repeated descriptions may be omitted.

FIG. 1 is a block diagram illustrating an electrostatic discharge (ESD) protection circuit according to example embodiments.

Referring to FIG. 1, an ESD protection circuit 1000 includes a transient-state detection circuit TSDC 100, a voltage detection circuit VDC 200, a trigger circuit TRC 300 and a main discharge circuit MDC 400.

The transient-state detection circuit 100 is connected between a first power rail PRL1 and a second power rail PRL2, and the transient-state detection circuit 100 generates a dynamic triggering signal DTR based on a voltage change rate of a voltage on the first power rail PRL1.

The voltage detection circuit 200 is connected between the first power rail PRL1 and the second power rail PRL2, and the voltage detection circuit 200 generates a static triggering signal STR based on the voltage on the first power rail.

A first voltage VDD is applied to the first power rail PRL1 and a second voltage VSS is applied to the second power rail PRL2. In some example embodiments, the first voltage VDD may be a power supply voltage and the second voltage VSS may be a ground voltage. Here, "voltage change rate" indicates a voltage change with respect to a unit time, that is, a time differential of a voltage.

The trigger circuit 300 is connected between the first power rail PRL1 and the second power rail PRL2, and the trigger circuit 300 generates a discharge control signal DCS based on the dynamic triggering signal and the static triggering signal. The main discharge circuit 400 is connected between the first power rail PRL1 and the second power rail PRL2, and the main discharge circuit 400 discharges an electric charge from the first power rail PRL1 to the second power rail PRL2 in response to an activation of the discharge control signal DCS.

As will be described below, the trigger circuit 300 may activate the discharge control signal DCS when both of the dynamic triggering signal DTR and the static triggering signal STR are activated. The main discharge circuit 400 may discharge the electric charge from the first power rail PRL1 to the second power rail PRL2 in response to an activation of the discharge control signal DCS.

The transient-state detection circuit 100 may activate the dynamic triggering signal DTR when the voltage change rate of the voltage on the first power rail PRL1 is higher than a reference rate, and the voltage detection circuit 200 may activate the static triggering signal STR when the voltage on the first power rail PRL1 is higher than a reference voltage. In other words, the transient-state detection circuit 100 may activate the dynamic triggering signal DTR when the voltage on the first power rail PRL1 increases rapidly and the voltage detection circuit 200 may activate the static triggering signal STR when the voltage on the first power rail PRL1 is high.

As such, the ESD protection circuit and the integrated circuit according to example embodiments may rapidly perform a discharging operation to protect the internal circuit, even in case of an ESD event having a short rising time and a high peak current. In addition, a leakage current due to a false triggering may be prevented to reduce power consumption by performing the discharging operation only in the transient state.

Figure 2:
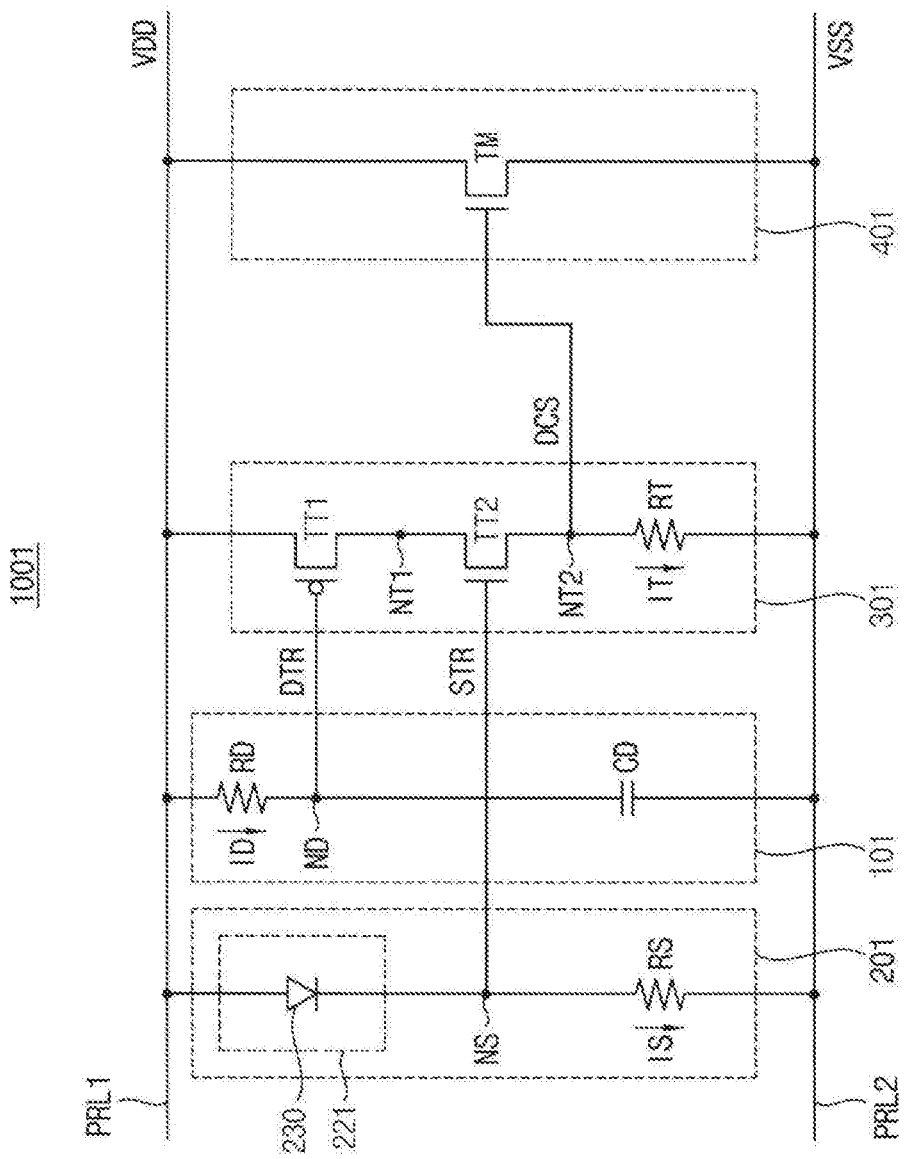
FIG. 2 is a circuit diagram illustrating an ESD protection circuit according to example embodiments.

FIG. 2 is a circuit diagram illustrating an ESD protection circuit according to example embodiments.

Referring to FIG. 2, an ESD protection circuit 1001 includes a transient-state detection circuit 101, a voltage detection circuit 201, a trigger circuit 301 and a main discharge circuit 401.

The trigger circuit 301 may include a first trigger transistor TT1, a second trigger transistor TT2 and a trigger resistor RT. The first trigger transistor TT1 is connected between the first power rail PRL1 and a first trigger node NT1, and the first trigger transistor TT1 has a gate electrode connected to the dynamic detection node ND to receive the dynamic triggering signal DTR. The second trigger transistor TT2 is connected between the first trigger node NT1 and a second trigger node NT2 corresponding to the discharge control signal DCS, and the second trigger transistor TT2 has a gate electrode connected to the static detection node NS to receive the static triggering signal STR. The trigger resistor RT is connected between the second trigger node NT2 and the second power rail PRL2.

As illustrated in FIG. 2, the first trigger transistor TT1 may be implemented with a p-channel metal oxide semiconductor (PMOS) transistor and the second trigger transistor TT2 may be implemented with an n-channel metal oxide semiconductor (NMOS) transistor. In this case, the transient-state detection circuit 101 may detect the transient state of the first power rail PRL1 through an RC combination as illustrated in FIG. 2.

The transient-state detection circuit 101 may include a dynamic detection resistor RD and a dynamic detection capacitor CD. The dynamic detection resistor RD is connected between the first power rail PRL1 and a dynamic detection node ND corresponding to the dynamic triggering signal DTR. The dynamic detection capacitor CD is connected between the dynamic detection node ND and the second power rail PRL2.

If a voltage of the dynamic detection capacitor CD is Vo and a voltage of the first power rail PRL1 is V, an electric charge Q charged on the dynamic detection capacitor and a gate-source voltage Vgs1 of the first trigger transistor TT1 may be represented by Expression 1 and Expression 2 as shown below, where CD represents a capacitance of the dynamic detection capacitor CD, ID represents a charging current flowing through the dynamic detection resistor RD, and RD represents a resistance of the dynamic detection resistor RD.

$$Q = CD * Vo \qquad \text{Expression 1}$$

$$Vgs1 = V - Vo = ID * RD \qquad \text{Expression 2}$$

Removing Vo from Expression 1 and Expression 2, results in the following Expression 3.

$$Q = C * (V - ID * RD) \qquad \text{Expression 3}$$

Differentiating both sides of Expression 3 with respect to time "t", results in the following Expression 4.

$$ID = dQ/dt = C * (dV/dt) - C * RD * (dID/dt) \qquad \text{Expression 4}$$

Accordingly, a voltage drop ID*RD caused by the charging current ID flowing through the dynamic detection resistor RD may be represented by Expression 5.

$$ID * RD = C * RD * (dV/dt) - C * RD * RD * (dID/dt) \qquad \text{Expression 5}$$

The differential equation of Expression 5 may be solved to determine the voltage drop ID*RD quantitatively, but it may be understood qualitatively that the voltage drop ID*RD increases as the voltage change rate dV/dt increases.

The dynamic triggering signal DTR may be activated when the voltage change rate dV/dt of the first power rail PRL1 is higher than a reference rate. Here, "activation of the dynamic triggering signal DTR" may represent that the dynamic triggering signal DTR has a voltage level that can turn on the first trigger transistor TT1. The first trigger transistor TT1 may be turned on when a gate-source voltage Vgs1 of the first trigger transistor TT1 is greater than a threshold voltage of the first trigger transistor TT1. Even though the relation between the threshold of the first trigger transistor TT1 and the reference rate is not solve exactly, it would be easily understood that the reference rate increases as the threshold voltage of the first trigger transistor TT1 increases.

When the first trigger transistor TT1 is a PMOS transistor as illustrated in FIG. 2, the first trigger transistor may be turned on when the voltage drop ID*RD by the charging current ID flowing through the dynamic detection resistor RD is greater than the threshold voltage of the first trigger transistor TT1. The voltage drop ID*RD corresponds to the gate-source voltage of the first trigger transistor TT1. As a result, the first trigger transistor TT1 may be turned on when the voltage change rate dV/dt is higher than the predetermined reference rate.

The voltage detection circuit 201 may include a diode circuit 221 and a static detection resistor RS. The diode circuit 221 is connected between the first power rail PRL1 and a static detection node NS corresponding to the static triggering signal STR. The static detection resistor RS is connected between the static detection node NS and the second power rail PRL2.

The static triggering signal STR may be activated when the voltage of the first trigger transistor TT1 is greater than a reference voltage. Here, "activation of the static triggering signal STR" may represent that the static triggering signal STR has a voltage level that can turn on the second trigger transistor TT2. The reference voltage corresponds to a voltage of the first trigger transistor TT1 when a voltage across a diode 230 in the diode circuit 221 becomes equal to a diffusion voltage of the diode 230.

When the voltage on the first power rail PRL1 is greater than the reference voltage, a forward current IS flows through the diode 230 and the static detection resistor RD. The second trigger transistor TT2 may be turned on when a gate-source voltage Vgs2 of the second trigger transistor TT2 is greater than a threshold voltage of the second trigger transistor TT2.

When the second trigger transistor TT2 is an NMOS transistor as illustrated in FIG. 2, a gate-source voltage Vgs2 of the second trigger transistor TT2 may be represented by Expression 6, where RS represents a resistance of the static detection resistor RS, RT represents a resistance of the trigger resistor RT, and IT represents a trigger current flowing through the trigger resistor RT.

$$Vgs2=IS*RS-IT*RT \qquad \text{Expression 6}$$

The second trigger transistor TT2 may be turned on when the gate-source voltage Vgs2 of the second trigger transistor TT2 is greater than the threshold voltage of the second trigger transistor TT2. The circuit may be designed such that the forward current IS is sufficiently high, and thus the second trigger transistor TT2 may be turned on when the voltage on the first power rail PRL1 is greater than the reference voltage. In other words, the second trigger transistor TT2 may be turned on when a current flows through the diode circuit 221.

The main discharge circuit 401 may include a discharge transistor TM. The discharge transistor TM is connected between the first power rail PRL1 and the second power rail PRL2, and the discharge transistor TM has a gate electrode connected to the second trigger node NT2 to receive the discharge control signal DCS. The discharge transistor TM may have relatively a large size to secure a sufficient discharging capacity.

The discharge control signal DCS may be activated when both of the dynamic triggering signal DTR and the static triggering signal STR are activated. Here, "activation of the discharge control signal DCS" may represent that the discharge control signal DCS has a voltage level that can turn on the discharge transistor TM. The main discharge circuit 401 may discharge the electric charge from the first power rail PRL1 to the second power rail PRL2 when the discharge control signal DCS is activated.

Both of the first trigger transistor TT1 and the second trigger transistor TT2 may be turned on and the trigger current IT may flow through the trigger resistor RT when both of the dynamic triggering signal DTR and the static triggering signal STR are activated.

When the discharge transistor TM is an NMOS transistor as illustrated in FIG. 2, a gate-source voltage Vgs3 of the discharge transistor TM may be represented by Expression 7, where RT represents a resistance of the trigger resistor RT.

$$Vgs3=IT*RT \qquad \text{Expression 7}$$

The discharge transistor TM may be turned on when the gate-source voltage Vgs3 of the discharge transistor TM is greater than the threshold voltage of the discharge transistor TM.

In some example embodiments, the circuit may be designed such that a capacitance of the second trigger node NT2, corresponding to a drain electrode of the second trigger transistor TT2, is sufficiently large. In this case, the trigger current IT may flow for a time even after the first trigger transistor TT1 is turned off, which increases the turn-on time of the discharge transistor to further enhance performance of the ESD protection circuit 1001.

Figure 3:
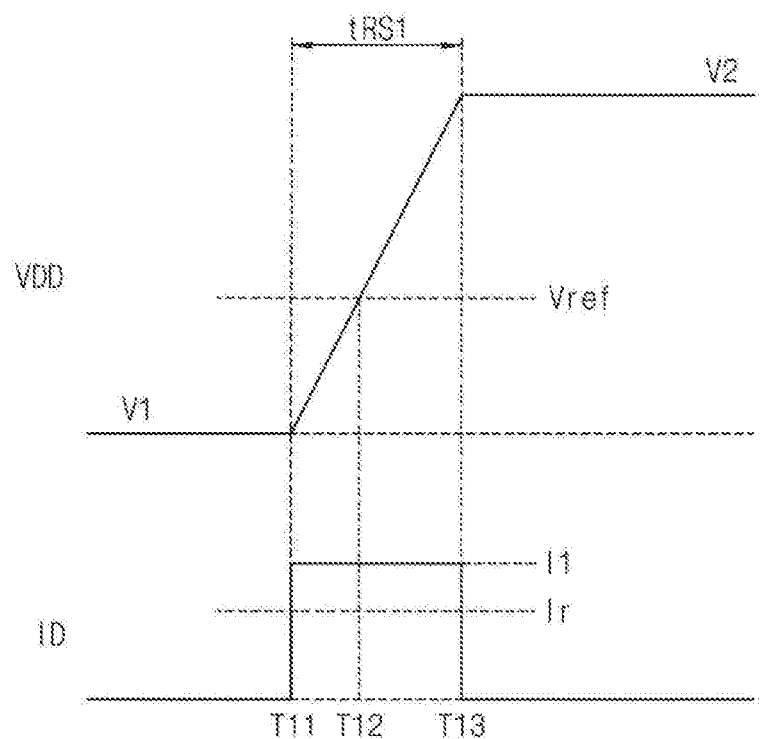
FIGS. 3 and 4 are diagrams for describing a triggering operation of the ESD protection circuit of FIG. 2 according to example embodiments.
Figure 4:
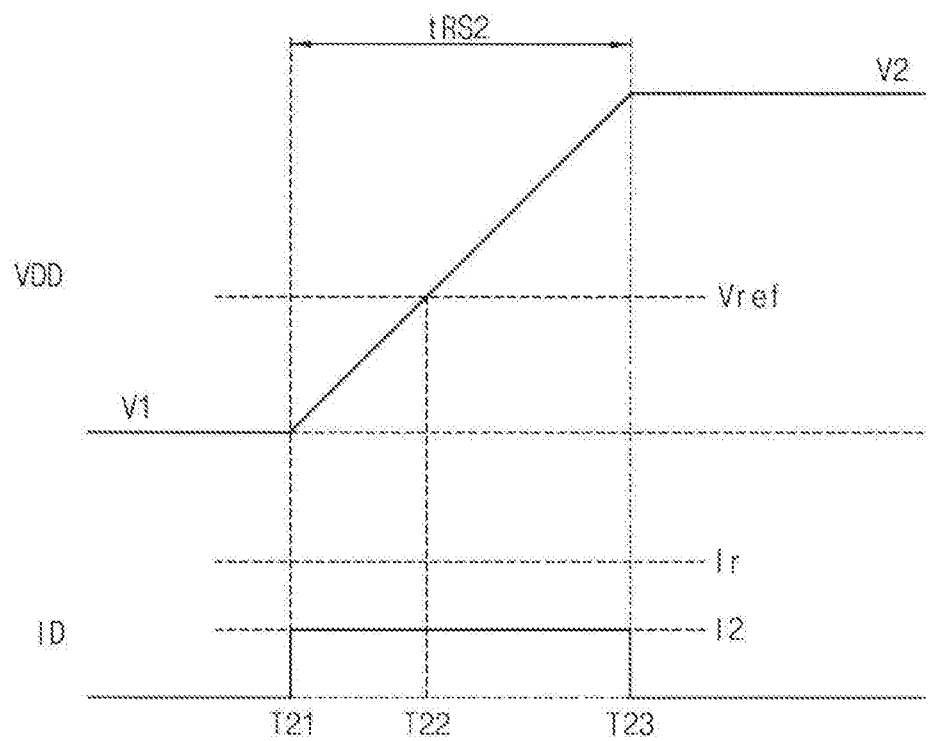

FIGS. 3 and 4 are diagrams for describing a triggering operation of the ESD protection circuit of FIG. 2 according to example embodiments.

FIG. 3 illustrates a case that a rising time tRS1 of a voltage VDD on the first power rail PRL1 from a first voltage level V1 to a second voltage level V2 is relatively short, and FIG. 4 illustrates a case that a rising time tRS2 is relatively long. In other words, the case of FIG. 3 corresponds to a relatively high voltage change rate (V2−V1)/tRS1 and the case of FIG. 4 corresponds to a relatively low voltage change rate (V2−V1)/tRS2.

Referring to FIGS. 2 and 3, at time point T11, the voltage VDD on the second power rail PRL2 begins to increase and the charging current ID flows through the dynamic detection resistor RD. The magnitude I1 of the charging current ID is greater than a reference current Ir corresponding to the above-described reference rate, and thus the first trigger transistor TT1 may be turned on.

At time T12, the voltage VDD on the first power rail PRL1 exceeds the above-described reference voltage Vref, the second trigger transistor TT2 is turned on and the trigger current IT flows through the trigger resistor RT. Accordingly the discharge transistor TM may be turned on by the voltage drop due to the trigger current IT and the discharging operation may be performed from time point T12.

At time point T13, the voltage VDD on the first power rail PRL1 changes from the transient state to a static state, the charging current ID stops flowing and the first trigger transistor is turned off. Here, "the transient state" represents a state that the voltage change rate on the first power rail PRL1 is higher than the reference rate.

If the capacitance of the second trigger node NT2 is designed to be sufficiently large as described above, the trigger current IT may flow for predetermined time duration even after time point T13 when the first trigger transistor TT1 is turned off.

As such, the ESD protection circuit 1001 and the integrated circuit including the ESD protection circuit 1001 may perform the discharging operation rapidly and protect an internal circuit stably even in case of an ESD event having a short rising time and a high peak current.

Referring to FIGS. 2 and 4, at time point T21, the voltage VDD on the second power rail PRL2 begins to increase and the charging current ID flows through the dynamic detection resistor RD. The magnitude I2 of the charging current ID is smaller than a reference current Ir corresponding to the above-described reference rate, and thus the first trigger transistor TT1 is not turned on.

At time T22, even though the voltage VDD on the first power rail PRL1 exceeds the above-described reference voltage Vref, the second trigger transistor TT2 is not turned on because the first trigger transistor TT1 is turned off. Accordingly the trigger current IT is not generated during time interval T21~T22 because the magnitude I2 of the charging current is small. The discharge transistor TM maintains the turned-off state and thus the main discharge circuit 401 does not perform the discharging operation.

As such, the ESD protection circuit 1001 and the integrated circuit including the ESD protection circuit 1001 may prevent a leakage current due to a false triggering to reduce power consumption by performing the discharging operation only in the transient state.

Figure 5:
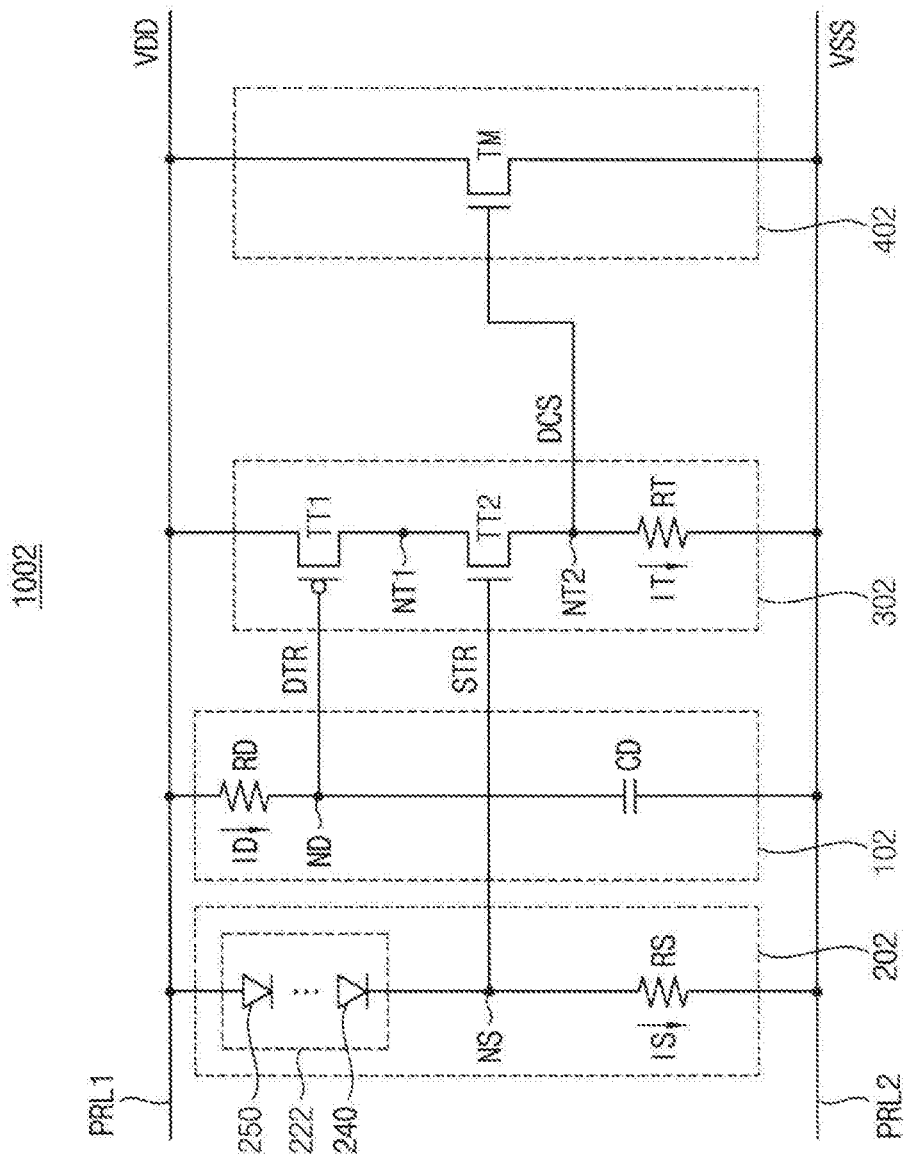
FIGS. 5 and 6 are circuit diagrams illustrating an ESD protection circuit according to example embodiments.
Figure 6:
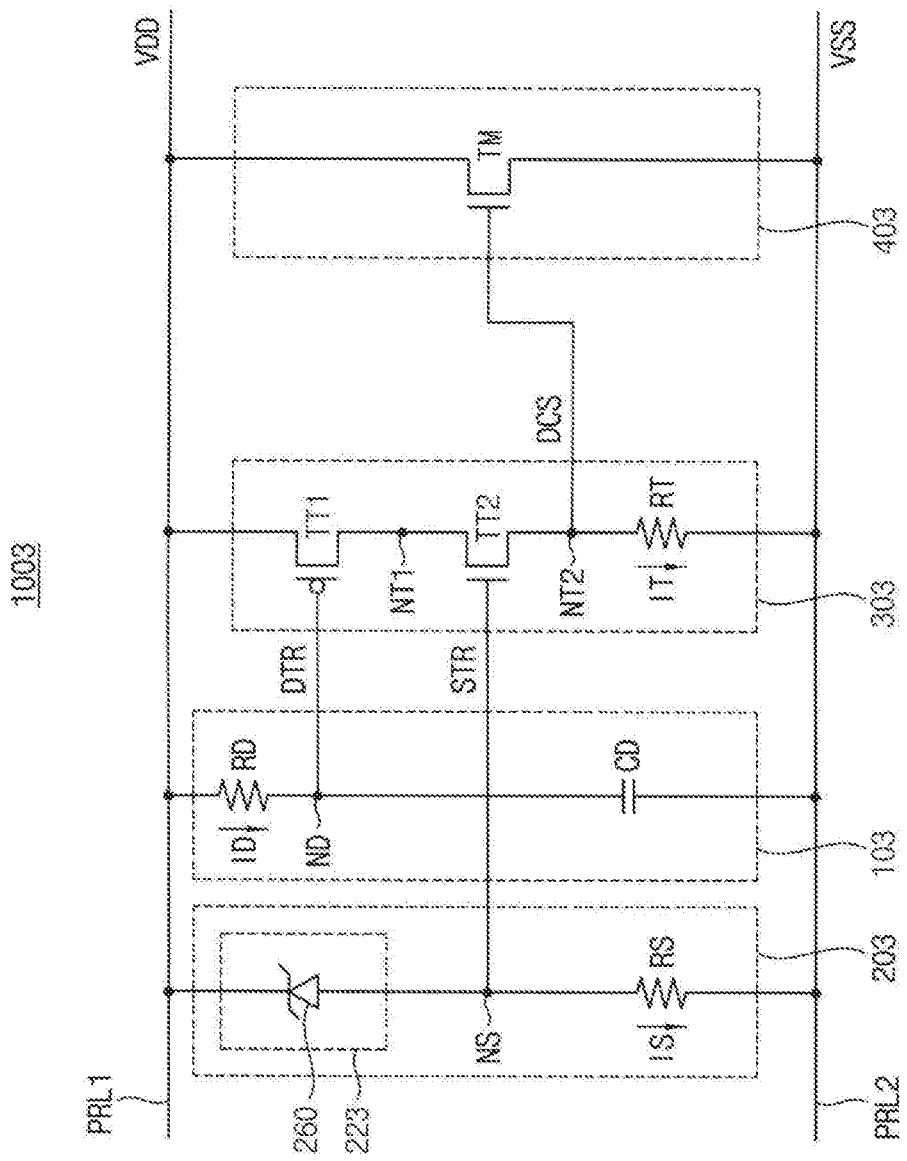

FIGS. 5 and 6 are circuit diagrams illustrating an ESD protection circuit according to example embodiments. Configurations of FIGS. 5 and 6 are similar to the configuration of FIG. 2, and the repeated descriptions may be omitted.

Referring to FIG. 5, an ESD protection circuit 1002 includes a transient-state detection circuit 102, a voltage detection circuit 202, a trigger circuit 302 and a main discharge circuit 402.

The trigger circuit 302 may include a first trigger transistor TT1, a second trigger transistor TT2 and a trigger resistor RT. The first trigger transistor TT1 is connected between the first power rail PRL1 and a first trigger node NT1, and the first trigger transistor TT1 has a gate electrode connected to the dynamic detection node ND to receive the dynamic triggering signal DTR. The second trigger transistor TT2 is connected between the first trigger node NT1 and a second trigger node NT2 corresponding to the discharge control signal DCS, and the second trigger transistor TT2 has a gate electrode connected to the static detection node NS to receive the static triggering signal STR. The trigger resistor RT is connected between the second trigger node NT2 and the second power rail PRL2.

The transient-state detection circuit 102 may include a dynamic detection resistor RD and a dynamic detection capacitor CD. The dynamic detection resistor RD is connected between the first power rail PRL1 and a dynamic detection node ND corresponding to the dynamic triggering signal DTR. The dynamic detection capacitor CD is connected between the dynamic detection node ND and the second power rail PRL2.

The voltage detection circuit 202 may include a diode circuit 222 and a static detection resistor RS. The diode circuit 222 is connected between the first power rail PRL1 and a static detection node NS corresponding to the static triggering signal STR. The static detection resistor RS is connected between the static detection node NS and the second power rail PRL2.

The main discharge circuit 402 may include a discharge transistor TM. The discharge transistor TM is connected between the first power rail PRL1 and the second power rail PRL2, and the discharge transistor TM has a gate electrode connected to the second trigger node NT2 to receive the discharge control signal DCS.

As illustrated in FIG. 5, the diode circuit 222 may include a plurality of diodes 240 and 250 forwardly connected in series between the first power rail PRL1 and the static detection node NS. FIG. 2 illustrates a non-limiting example of two diodes 240 and 250 for convenience of illustration, however example embodiments are not limited thereto and the diode circuit 222 may include three or more diodes connected in series. The above-described reference voltage Vref may be increased by increasing the number of the serially-connected diodes.

Referring to FIG. 6, an ESD protection circuit 1003 includes a transient-state detection circuit 103, a voltage detection circuit 203, a trigger circuit 303 and a main discharge circuit 403.

The trigger circuit 303 may include a first trigger transistor TT1, a second trigger transistor TT2 and a trigger resistor RT. The first trigger transistor TT1 is connected between the first power rail PRL1 and a first trigger node NT1, and the first trigger transistor TT1 has a gate electrode connected to the dynamic detection node ND to receive the dynamic triggering signal DTR. The second trigger transistor TT2 is connected between the first trigger node NT1 and a second trigger node NT2 corresponding to the discharge control signal DCS, and the second trigger transistor TT2 has a gate electrode connected to static detection node NS to receive the static triggering signal STR. The trigger resistor RT is connected between the second trigger node NT2 and the second power rail PRL2.

The transient-state detection circuit 103 may include a dynamic detection resistor RD and a dynamic detection capacitor CD. The dynamic detection resistor RD is connected between the first power rail PRL1 and a dynamic detection node ND corresponding to the dynamic triggering signal DTR. The dynamic detection capacitor CD is connected between the dynamic detection node ND and the second power rail PRL2.

The voltage detection circuit 203 may include a diode circuit 223 and a static detection resistor RS. The diode circuit 223 is connected between the first power rail PRL1 and a static detection node NS corresponding to the static triggering signal STR. The static detection resistor RS is connected between the static detection node NS and the second power rail PRL2.

The main discharge circuit 403 may include a discharge transistor TM. The discharge transistor TM is connected between the first power rail PRL1 and the second power rail PRL2, and the discharge transistor TM has a gate electrode connected to the second trigger node NT2 to receive the discharge control signal DCS.

As illustrated in FIG. 6, the diode circuit 223 may include a Zener diode 260 having a cathode electrode connected to the first power rail PRL1 and an anode electrode connected to the static detection node NS. The above-described reference voltage Vref may be controlled by adjusting a breakdown voltage of the Zener diode 260.

Figure 7:
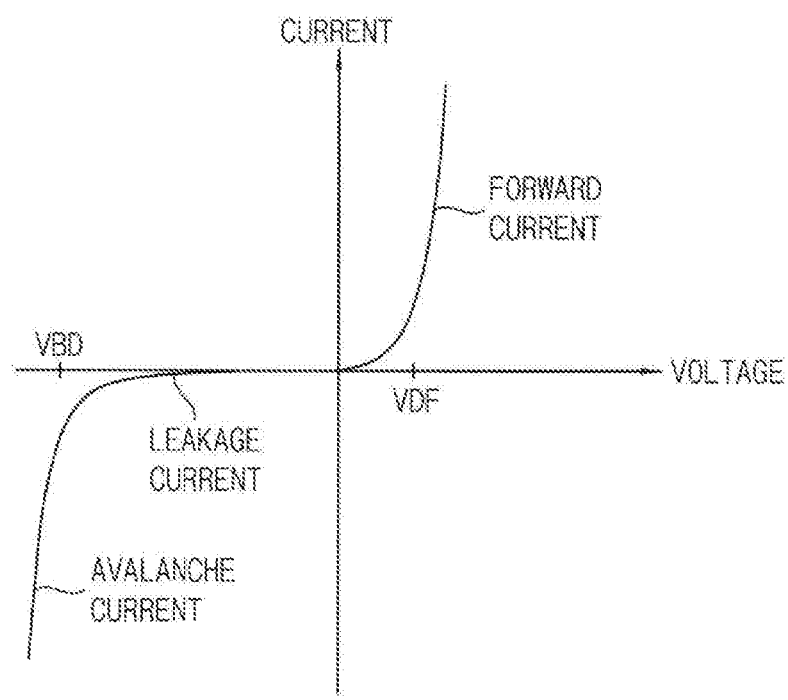
FIG. 7 is a diagram illustrating characteristics of a diode of a voltage detection circuit included in an ESD protection circuit according to example embodiments.

FIG. 7 is a diagram illustrating characteristics of a diode of a voltage detection circuit included in an ESD protection circuit according to example embodiments.

In FIG. 7, a horizontal axis represents a bias voltage applied between both ends of a diode, and a vertical axis represents a current flowing through the diode. In general, a diode is a device for generating a forward current, that is, a current from an anode electrode to a cathode electrode. The diode may be formed by a PN junction, that is, a junction between a p-type semiconductor having holes and an n-type semiconductor having electrons. A depletion layer is caused near a boundary surface of the PN junction by diffusions of the holes and the electrons and a thickness of the depletion is limited by an electric field of the depletion layer. If a forward bias voltage is applied, the depletion layer disappears gradually and the forward current increases abruptly when the forward bias voltage approaches a diffusion voltage VDF. The diffusion voltage VDF may be adjusted by adjusting the number of the diodes and impurity densities in the diodes. Through the adjustment of the diffusion voltage VDF, the above-described reference voltage associated with turn-on condition of the second trigger transistor TT2 may be adjusted.

When a reverse bias voltage is applied, a leakage current is caused in a reverse direction, that is, from the cathode electrode to the anode electrode. If the reverse bias voltage exceeds a breakdown voltage VBD, the internal structure of the diode is destroyed and an avalanche current is generated.

A Zener diode is used to obtain a constant voltage using a Zener effect, and may be referred to as a constant-voltage diode. Also, the Zener diode is formed by a PN junction and the Zener diode may include higher density of impurities than a typical diode. The Zener diode may provide a current corresponding to the breakdown voltage VBD that is adjusted by the impurity density. Through the adjustment of the breakdown voltage VBD, the above-described reference voltage associated with turn-on condition of the second trigger transistor TT2 may be adjusted.

Hereinafter, a semiconductor device of an on-chip Schottky diode pair applicable to an ESD protection circuit according to example embodiments will be described with reference to FIGS. 8 and 9.

Figure 8:
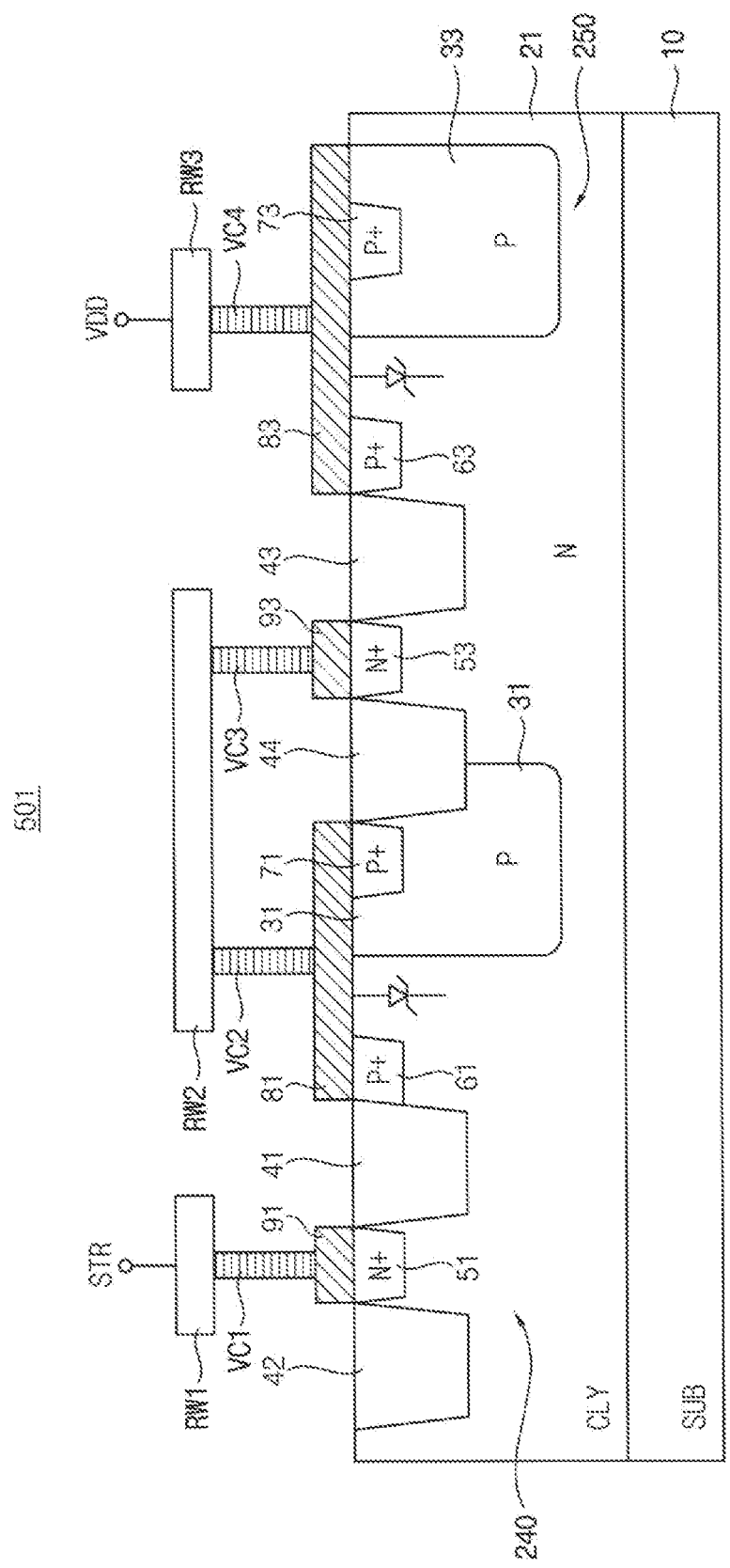
FIGS. 8 and 9 are cross-sectional views of a diode of a voltage detection circuit included in an ESD protection circuit according to example embodiments.
Figure 9:
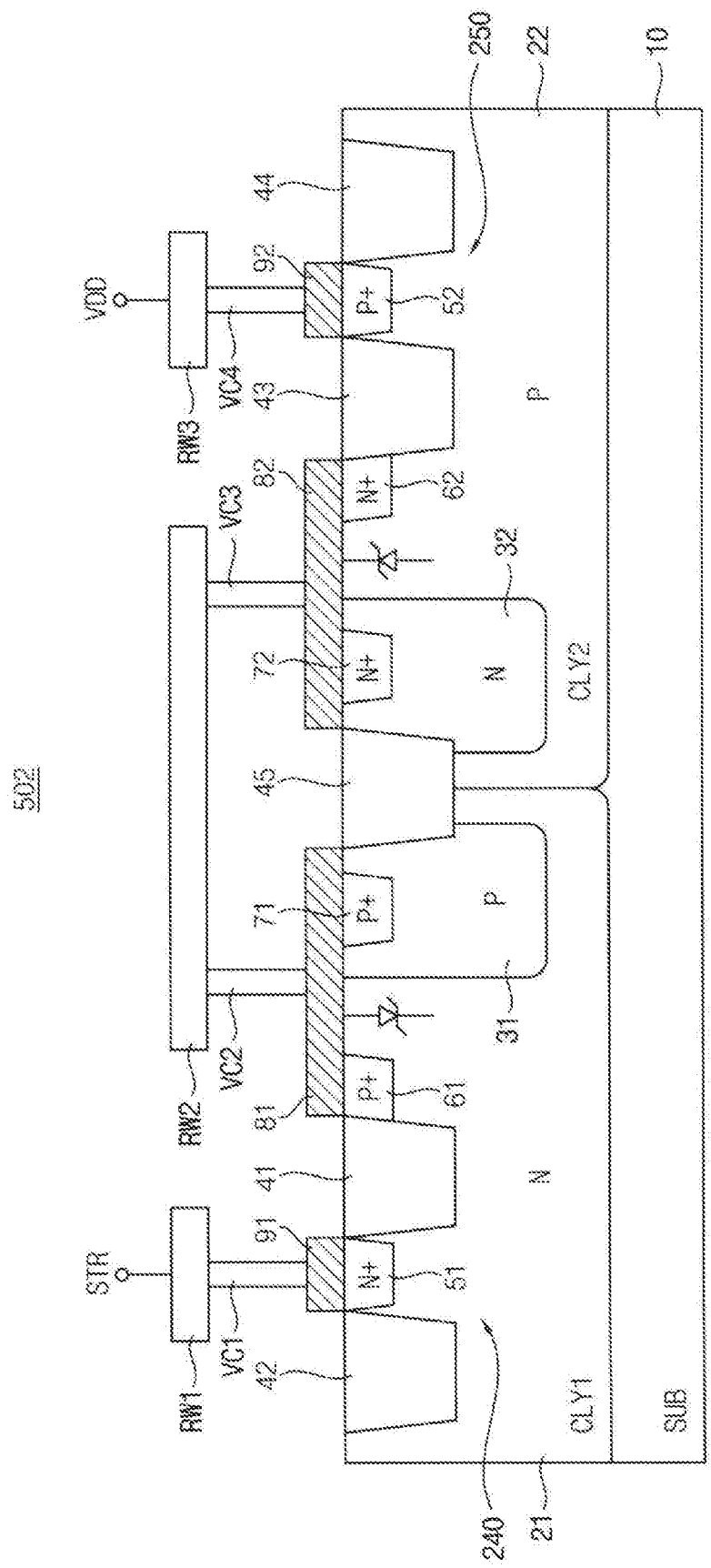

FIGS. 8 and 9 are cross-sectional views of example embodiments of a diode of a voltage detection circuit included in an ESD protection circuit according to example embodiments.

As example embodiments, FIGS. 8 and 9 illustrate a first Schottky diode 240 and a second Schottky diode 250 that may be included in the diode circuit 222 in FIG. 5. The Schottky diode is a semiconductor device including a Schottky junction between a metal and a semiconductor. The Schottky diode has operational characteristics due to multiple carriers and the Schottky diode has a rapid switching speed. The Schottky diode may provide a lower voltage drop in an on-state in comparison with a PN diode because the Schottky diode is driven by tunneling using the Schottky junction.

Referring to FIG. 8, an integrated circuit 501 includes a conduction layer CLY 21 disposed on a semiconductor substrate SUB 10, well regions 31 and 33, isolation regions 41, 42, 43 and 44, junction regions 51, 53, 61, 63, 71 and 73 disposed in the conduction layer 21, and electrodes 81, 83, 91 and 93. The conduction layer 21 and the junction regions 51 and 53 correspond to the N-type. The junction region 51 and 53 may be doped with an N-type impurity to have a higher impurity concentration than the conduction layer 21. The well regions 31 and 33 and the junction regions 61, 63, 71 and 73 correspond to the P-type. The junction regions 61, 63, 71 and 73 may be doped with a P-type impurity to have a higher impurity concentration than the well regions 31 and 33. As a result, the Schottky electrodes 81 and 83 may correspond to anodes and the ohmic electrodes 91 and 93 may correspond to cathodes.

Vertical contacts VC1, VC2, VC3 and VC4 are formed on the electrodes 81, 83, 91 and 93 to electrically connect the electrodes 81, 83, 91 and 93 to upper wirings RW1, RW2 and RW3. As illustrated in FIG. 8, the static triggering signal STR may be generated at a cathode of a first Schottky diode 240 and an anode of the first Schottky diode 240 may be electrically connected to the upper wiring RW2. Also a cathode of a second Schottky diode 250 may be electrically connected to the upper wiring RW2 and an anode of the second Schottky diode 250 may be electrically connected to the power supply voltage VDD.

Referring to FIG. 9, an integrated circuit 502 includes first and second conduction layers CLY1 21 and CLY2 22 formed on a semiconductor substrate SUB 10, first and second well regions 31 and 32, isolation regions 41, 42, 43, 44 and 45, junction regions 51, 52, 61, 62, 71 and 72 disposed in the conduction layers 21 and 23, and electrodes 81, 82, 91 and 92. The isolation regions 41 and 42 and the junction regions 51 and 61 are disposed in the conduction layer 21. The isolation regions 43 and 44 and the junction regions 52 and 62 are disposed in the conduction layer 22. The first conduction layer 21, the second well region 32 and the junction regions 51, 62 and 72 correspond to the N-type. The junction regions 51, 62 and 72 may be doped with an N-type impurity to have a higher impurity concentration than the first conduction layer 21 and the second well region 32. The second conduction layer 22, the first well region 31 and the junction regions 52, 61 and 71 correspond to the P-type. The junction regions 52, 61 and 71 may be doped with a P-type impurity to have a higher impurity concentration than the second conduction layer 22 and the first well region 31. As a result, the first Schottky electrode 81 and the second ohmic electrode 92 may correspond to anodes and the second Schottky electrode 82 and the first ohmic electrode 91 may correspond to cathodes.

Vertical contacts VC1, VC2, VC3 and VC4 may be formed on the electrodes 81, 82, 91 and 92 to electrically connect the electrodes 81, 82, 91 and 92 to upper wirings RW1, RW2 and RW3. As illustrated in FIG. 9, the static triggering signal STR may be generated at a cathode of a first Schottky diode 240 and an anode of the first Schottky diode 240 may be electrically connected to the upper wiring RW2. Also a cathode of a second Schottky diode 250 may be electrically connected to the upper wiring RW2 and an anode of the second Schottky diode 250 may be electrically connected to the power supply voltage VDD.

Even though the example embodiments that the diode circuit in the voltage detection circuit includes the two serially-connected Schottky diodes with reference to FIGS. 8 and 9, it would be easily understood that the diode circuit may include one, three or more diode of various types.

Figure 10:
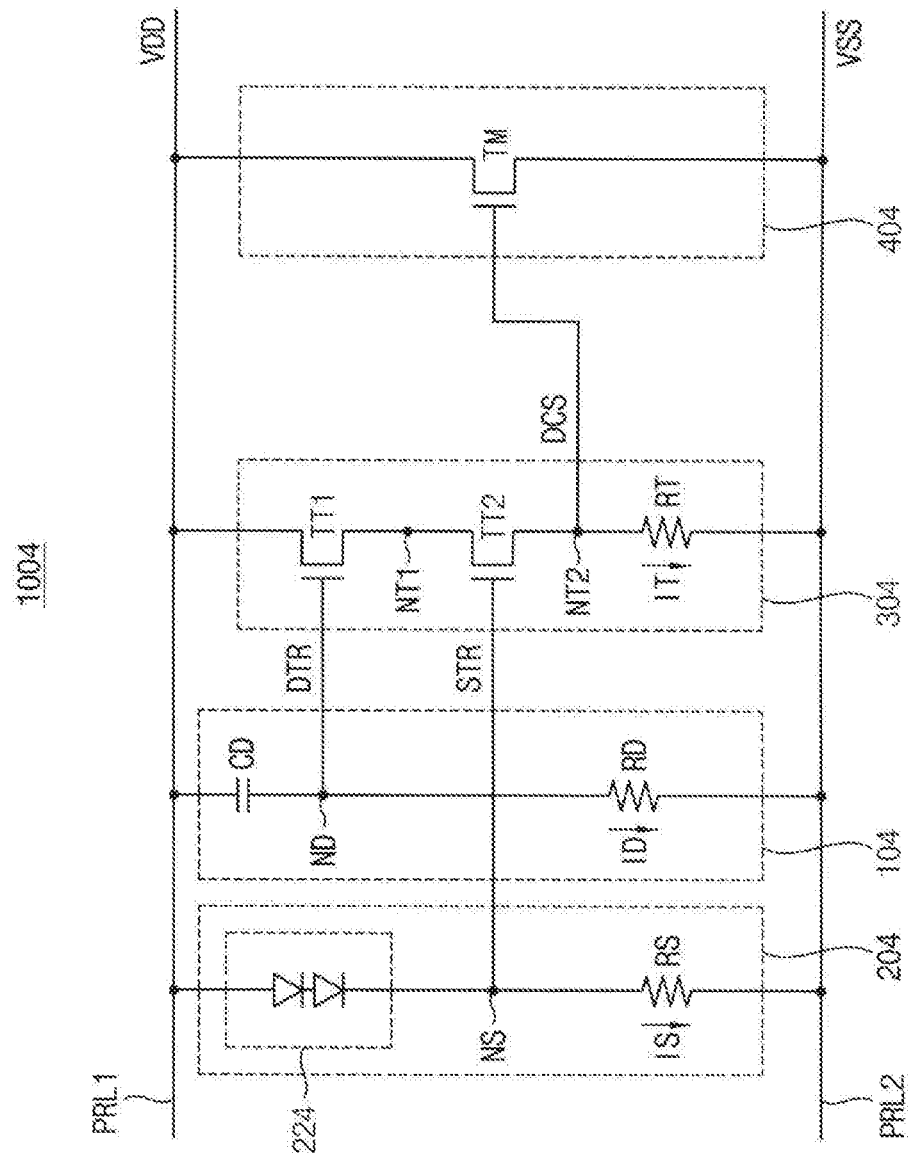
FIGS. 10 and 11 are circuit diagrams illustrating an ESD protection circuit according to example embodiments.
Figure 11:
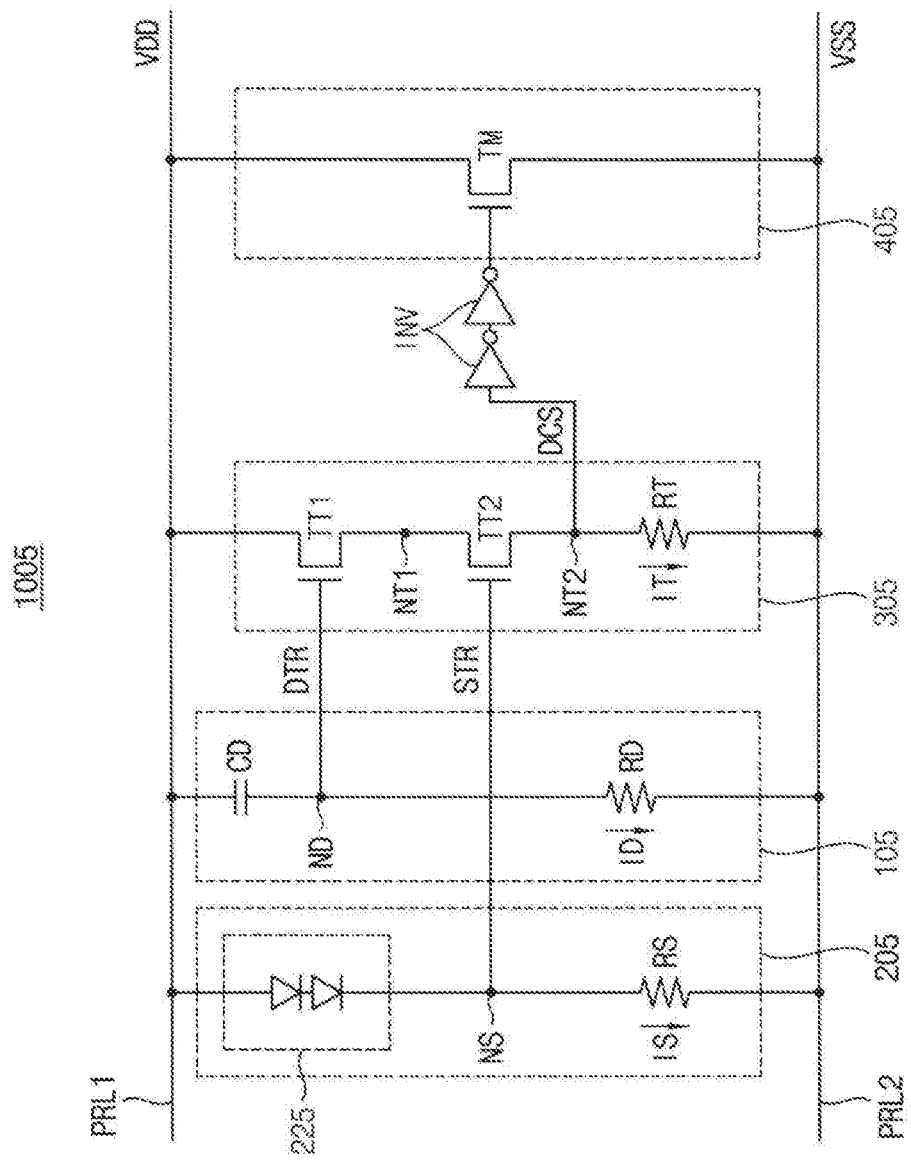

FIGS. 10 and 11 are circuit diagrams illustrating an ESD protection circuit according to example embodiments.

Referring to FIG. 10, an ESD protection circuit 1004 includes a transient-state detection circuit 104, a voltage detection circuit 204, a trigger circuit 304 and a main discharge circuit 404.

The trigger circuit 304 may include a first trigger transistor TT1, a second trigger transistor TT2 and a trigger resistor RT. The first trigger transistor TT1 is connected between the first power rail PRL1 and a first trigger node NT1, and the first trigger transistor TT1 has a gate electrode connected to the dynamic detection node ND to receive the dynamic triggering signal DTR. The second trigger transistor TT2 is connected between the first trigger node NT1 and a second trigger node NT2 corresponding to the discharge control signal DCS, and the second trigger transistor TT2 has a gate electrode connected to the static detection node NS to receive the static triggering signal STR. The trigger resistor RT is connected between the second trigger node NT2 and the second power rail PRL2.

As illustrated in FIG. 10, both of the first trigger transistor TT1 and the second trigger transistor TT2 may be implemented with NMOS transistors. In this case, the transient-state detection circuit 104 may detect the transient state of the first power rail PRL1 through an RC combination as illustrated in FIG. 10.

The transient-state detection circuit 104 may include a dynamic detection capacitor CD and a dynamic detection resistor RD. The dynamic detection capacitor CD is connected between the first power rail PRL1 and a dynamic detection node ND which corresponds to the dynamic triggering signal DTR. The dynamic detection resistor RD is connected between the dynamic detection node ND and the second power rail PRL2.

The dynamic triggering signal DTR may be activated when the voltage change rate dV/dt of the first power rail PRL1 is higher than a reference rate. Here, "activation of the dynamic triggering signal DTR" may represent that the dynamic triggering signal DTR has a voltage level that can turn on the first trigger transistor TT1.

The voltage detection circuit 204 may include a diode circuit 224 and a static detection resistor RS. The diode circuit 224 is connected between the first power rail PRL1 and a static detection node NS corresponding to the static triggering signal STR. The static detection resistor RS is connected between the static detection node NS and the second power rail PRL2.

The static triggering signal STR may be activated when the voltage of the first trigger transistor TT1 is larger than a reference voltage. Here, "activation of the static triggering signal STR" may represent that the static triggering signal STR has a voltage level that can turn on the second trigger transistor TT2.

The main discharge circuit 404 may include a discharge transistor TM. The discharge transistor TM is connected between the first power rail PRL1 and the second power rail PRL2, and the discharge transistor TM has a gate electrode connected to the second trigger node NT2 to receive the discharge control signal DCS.

The discharge control signal DCS may be activated when both of the dynamic triggering signal DTR and the static triggering signal STR are activated. Here, "activation of the discharge control signal DCS" may represent that the discharge control signal DCS has a voltage level that can turn on the discharge transistor TM. The main discharge circuit 404 may discharge the electric charge from the first power rail PRL1 to the second power rail PRL2 when the discharge control signal DCS is activated.

Both of the first trigger transistor TT1 and the second trigger transistor TT2 may be turned on and the trigger current IT may flow through the trigger resistor RT when both of the dynamic triggering signal DTR and the static triggering signal STR are activated. The discharge transistor TM may be turned on when the gate-source voltage of the discharge transistor TM is larger than the threshold voltage of the discharge transistor TM.

Referring to FIG. 11, an ESD protection circuit 1005 includes a transient-state detection circuit 105, a voltage detection circuit 205, a trigger circuit 305, a main discharge circuit 405 and one or more inverters INV.

The trigger circuit 305 may include a first trigger transistor TT1, a second trigger transistor TT2 and a trigger resistor RT. The first trigger transistor TT1 is connected between the first power rail PRL1 and a first trigger node NT1, and the first trigger transistor TT1 has a gate electrode connected to the dynamic detection node ND to receive the dynamic triggering signal DTR. The second trigger transistor TT2 is connected between the first trigger node NT1 and a second trigger node NT2 corresponding to the discharge control signal DCS, and the second trigger transistor TT2 has a gate electrode connected to the static detection node NS to receive the static triggering signal STR. The trigger resistor RT is connected between the second trigger node NT2 and the second power rail PRL2.

The transient-state detection circuit 105 may include a dynamic detection capacitor CD and a dynamic detection resistor RD. The dynamic detection capacitor CD is connected between the first power rail PRL1 and a dynamic detection node ND corresponding to the dynamic triggering signal DTR. The dynamic detection resistor RD is connected between the dynamic detection node ND and the second power rail PRL2.

The voltage detection circuit 205 may include a diode circuit 225 and a static detection resistor RS. The diode circuit 225 is connected between the first power rail PRL1 and a static detection node NS corresponding to the static triggering signal STR. The static detection resistor RS is connected between the static detection node NS and the second power rail PRL2.

The main discharge circuit 405 may include a discharge transistor TM. The discharge transistor TM is connected between the first power rail PRL1 and the second power rail PRL2, and the discharge transistor TM has a gate electrode connected to the second trigger node NT2 to receive the discharge control signal DCS.

In comparison with the ESD protection circuit 1001 of FIG. 2, the ESD protection circuit 1005 of FIG. 11 further includes the inverters INV that are connected between the second trigger node NT2 and the gate electrode of the discharge transistor TM. The discharge control signal DCS may be amplified using the inverters INV and the discharging capacity of the discharge transistor TM may be enhanced by applying the amplified signal to the gate electrode of the discharge transistor TM.

Figure 12:
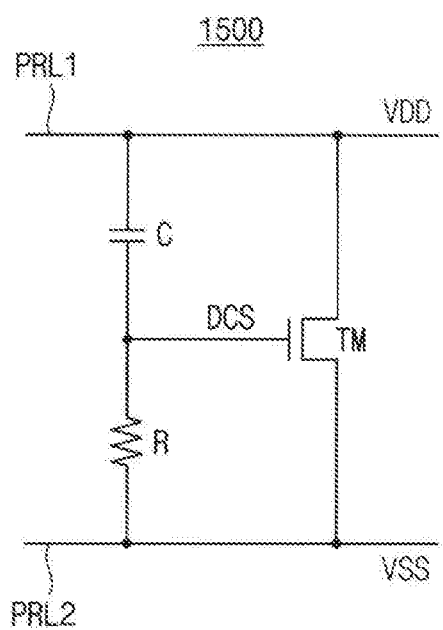
FIG. 12 is a circuit diagram illustrating an ESD protection circuit using RC triggering.

FIG. 12 is a circuit diagram illustrating an ESD protection circuit using RC triggering.

Referring to FIG. 12, a ESD protection circuit 1500 generates a discharge control signal DCS using a capacitor C and a resistor R that are connected between a first power rail PRL1 and a second power rail PRL2, and apply the discharge control signal DCS directly to a gate electrode of a discharge transistor TM. The discharging capacity may be compared between the ESD protection circuit 1500 of a pure-transient triggering scheme and the ESD protection circuit according to example embodiments.

Figure 13:
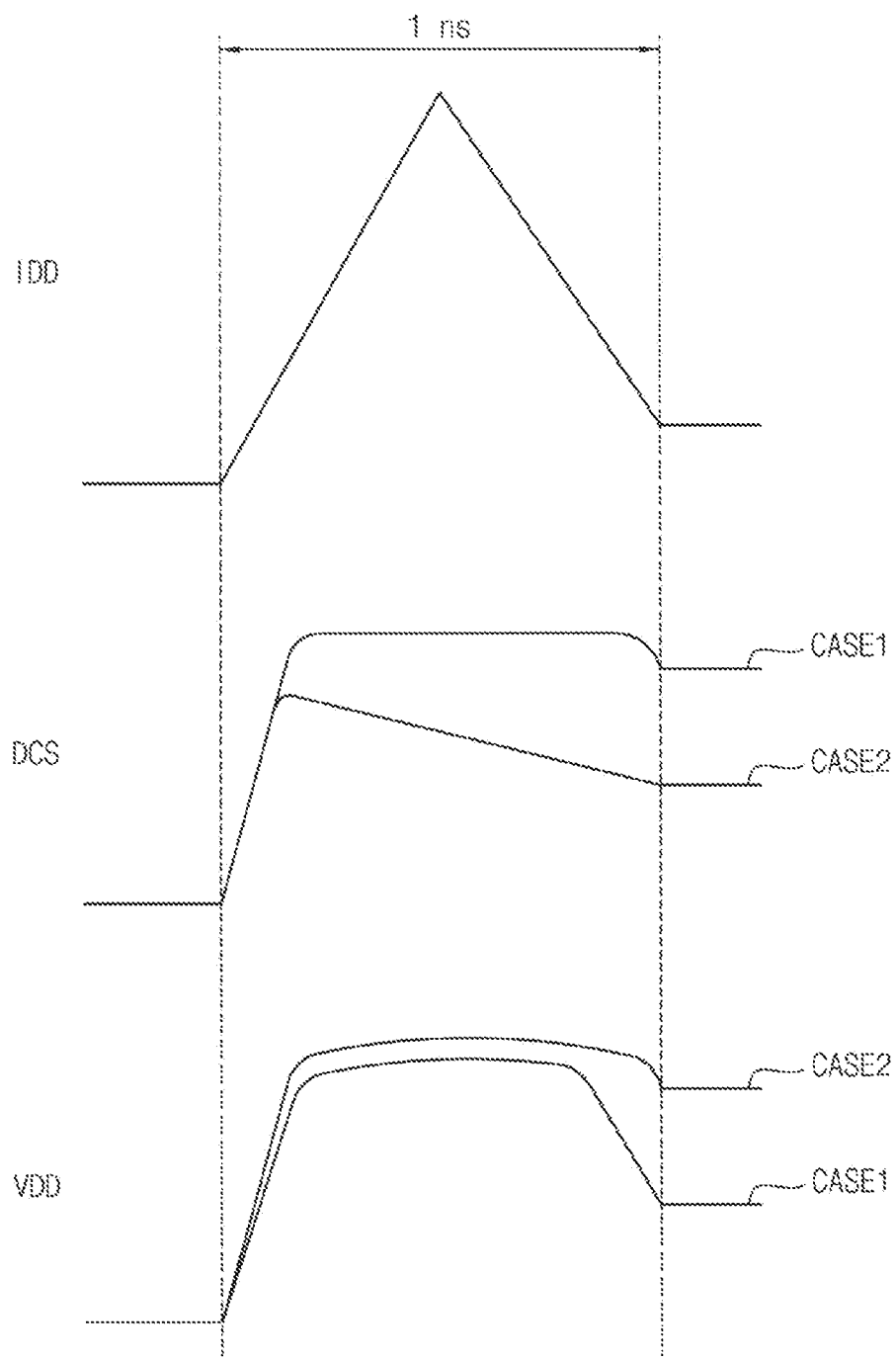
FIG. 13 is a diagram for describing a discharging capability of an ESD protection circuit according to example embodiments.

FIG. 13 is a diagram for describing a discharging capability of an ESD protection circuit according to example embodiments.

In FIG. 13, a first case CASE1 represents a simulation result when a current waveform IDD of about 1 nanosecond (ns) is applied to the ESD protection circuit 1001 of FIG. 2 according to example embodiments, and a second case CASE2 represents a simulation result when the same current waveform IDD is applied to the ESD protection circuit of FIG. 12 of the pure-transient triggering scheme.

A gate signal of the discharge transistor may be provided using an RC-triggering circuit or a voltage-triggering circuit. The RC-triggering scheme may not perform sufficient charging and discharging in case of an ESD event having a short rising time of a few nanoseconds. The voltage triggering scheme may be proper for protection of the internal circuit because it provides rapid discharging operation. However, the voltage-triggering scheme may increase power consumption by causing a leakage current due to false triggering even during a normal operation of the internal circuit.

As illustrated in FIG. 13, when the charged capacitor C is discharged, the voltage level of the discharge control signal DCS is decreased gradually in the second case CASE2, but the voltage level of the discharge control signal DCS is maintained in the first case CASE1. Thus the voltage VDD of first power rail PRL1 may be decreased sufficiently through the discharging operation in the first case CASE1 but the discharging is not sufficient in the second case CASE2. As such, the ESD protection circuit 1001 in FIG. 2 may have the enhanced discharging capacity and is proper for the protection of the internal circuit in comparison with the ESD protection circuit 1500 of the pure-transient triggering scheme in FIG. 12.

As such, the ESD protection circuit and the integrated circuit according to example embodiments may perform the discharging operation rapidly and protect the internal circuit stably even in case of an ESD event having a short rising time and a high peak current. In addition, a leakage current due to a false triggering may be prevented to reduce power consumption by performing the discharging operation only in the transient state.

Figure 14:
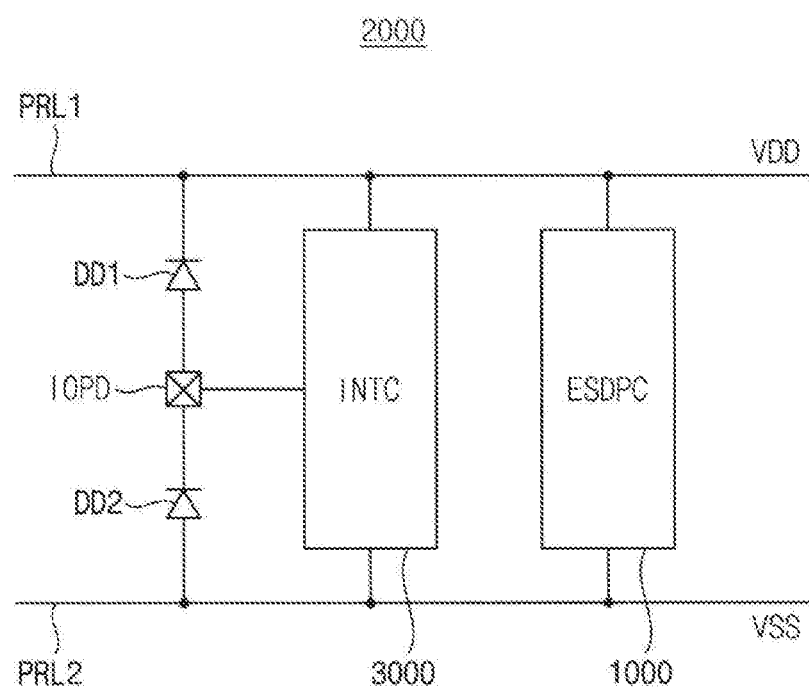
FIG. 14 is a diagram illustrating an integration circuit according to example embodiments.

FIG. 14 is a diagram illustrating an integration circuit according to example embodiments.

Referring to FIG. 14, an integrated circuit 2000 includes an ESD protection circuit ESDPC 1000, an internal circuit INTC 3000 and first and second clamp diodes DD1 and DD2.

The first clamp diode DD1 has an anode electrode connected to an input-output pad IOPD of the internal circuit 3000 and a cathode electrode connected to a first power rail PRL1. The second clamp diode DD2 has an anode electrode connected to a second power rail PRL2 and a cathode electrode connected to the input-output pad IOPD.

If a positive ESD surge or a positive ESD event is caused at the input-output pad IOPD, the voltage level of the input-output pad IOPD is increased and the first clamp diode DD1 may be turned on forwardly and the positive ESD surge may be discharged to the first power rail PRL1. As a result, the internal circuit 3000 may be protected by the positive ESD surge.

In contrast, if a negative ESD surge or a negative ESD event is caused at the input-output pad IOPD, the voltage level of the input-output pad IOPD is decreased and the second clamp diode DD2 may be turned on forwardly and the negative ESD surge may be discharged to the second power rail PRL2. As a result, the internal circuit 3000 may be protected by the negative ESD surge.

If a positive ESD surge occurs at the first power rail PRL1, the ESD protection circuit 1000 may perform the discharging operation to discharge the positive surge from the first power rail PRL1 to the second power rail PRL2. As a result the internal circuit 3000 may be protected by the positive ESD surge.

The ESD protection circuit 1000 may include a transient-state detection circuit, a voltage detection circuit, a trigger circuit and a main discharge circuit as described above. The transient-state detection circuit may generate a dynamic triggering signal based on a voltage change rate of a voltage on a first power rail. The voltage detection circuit may generate a static triggering signal based on the voltage on the first power rail. The trigger circuit may generate a discharge control signal based on the dynamic triggering signal and the static triggering signal. The main discharge circuit may discharge an electric charge from the first power rail to a second power rail based on the discharge control signal.

Figure 15:
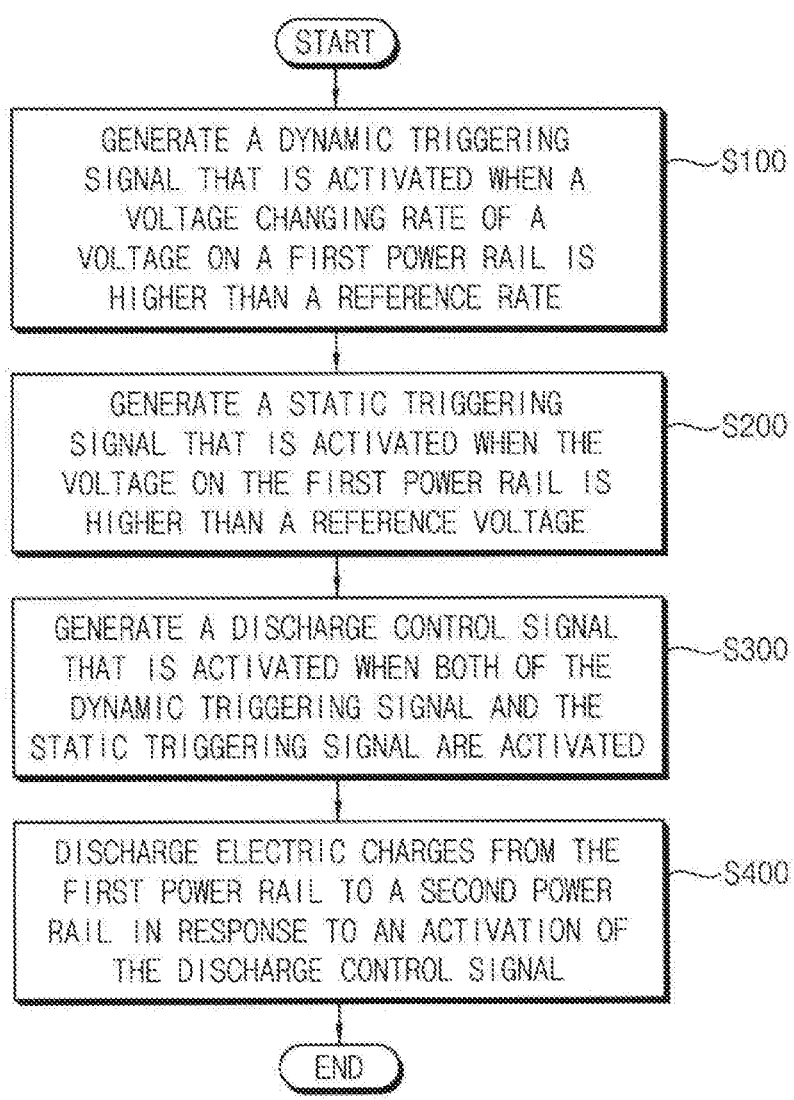
FIG. 15 is a flow chart illustrating a method of ESD protection according to example embodiments.

FIG. 15 is a flow chart illustrating a method of ESD protection according to example embodiments.

Referring to FIG. 15, a dynamic triggering signal such that is activated when a voltage change rate of a voltage on a first power rail is higher than a reference rate may be generated (S100). In addition, a static triggering signal that is activated when the voltage on the first power rail is higher than a reference voltage may be generated (S200). A discharge control signal that is activated when both of the dynamic triggering signal and the static triggering signal are activated may be generated (S300). Electric charges may be discharged from the first power rail to a second power rail in response to an activation of the discharge control signal (S400).

As such, the ESD protection method according to example embodiments may perform the discharging operation rapidly and protect the internal circuit stably even in case of an ESD event having a short rising time and a high peak current. In addition, a leakage current due to a false triggering may be prevented to reduce power consumption by performing the discharging operation only in the transient state.

Figure 16:
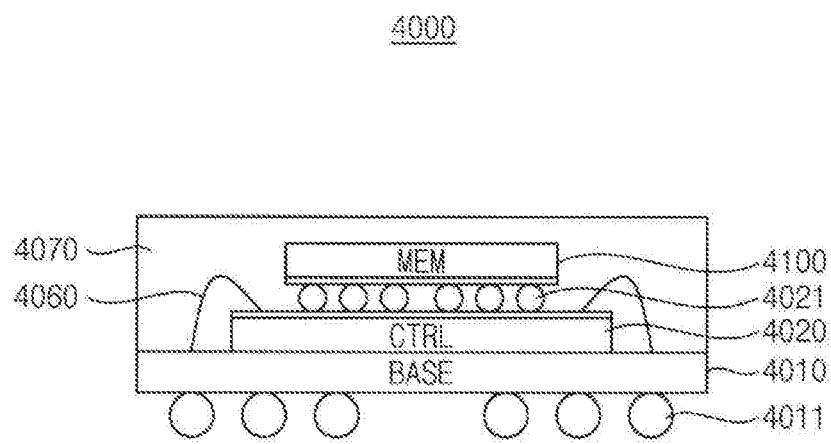
FIGS. 16 and 17 are diagrams illustrating a semiconductor package according to example embodiments.
Figure 17:
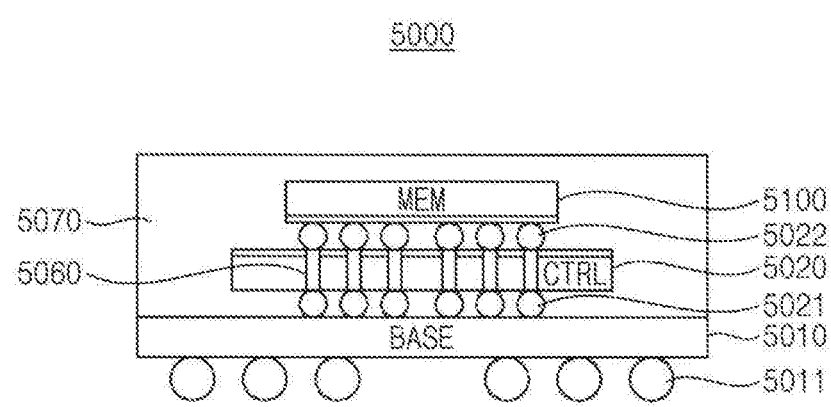

FIGS. 16 and 17 are diagrams illustrating a semiconductor package according to example embodiments.

Referring to FIG. 16, a semiconductor package 4000 includes a base substrate (BASE) 4010, a controller chip (CTRL) 4020 disposed on the base substrate 4010, and at least one semiconductor memory chip (MEM) 4100 disposed on the controller chip 4020. The base substrate 4010 may be a printed circuit board, and the controller chip 4020 may include a microprocessor unit (MPU). After the chips 4010, 4020 and 4100 are stacked on each other, the upper portion of the semiconductor package 4000 is covered with resin 4070.

The semiconductor memory chip 4100 and the controller chip 4020 are electrically connected to each other through the input-output bumps 4021 that are formed on the semiconductor memory chip 4100. The controller chip 4020 and the base substrate 4010 are electrically connected to each other using wires 4060. Bumps 4011 for electrical connection to an external device are formed under the bottom surface of the base substrate 4010.

The semiconductor memory chip 4100 and/or the controller chip 4020 include an ESD protection circuit as disclosed herein. The ESD protection circuit protects the internal circuits from ESD events that may occur through the bumps 4011 that are exposed.

Referring to FIG. 17, a semiconductor package 5000 includes a base substrate (BASE) 5010, a controller chip (CTRL) 5020 disposed on the base substrate 5010, and at least one semiconductor memory chip (MEM) 5100 disposed on the controller chip 5020. The base substrate 5010 may be a printed circuit board, and the controller chip 5020 may include a microprocessor unit (MPU). After the chips 5010, 5020 and 5100 are stacked on each other, the upper portion of the semiconductor package 5000 is covered with resin 5070.

The semiconductor memory chip 5100 and the controller chip 5020 are electrically connected to each other through the input-output bumps 5022 that are formed on the semiconductor memory chip 5100. The controller chip 5020 and the base substrate 5010 are electrically connected to each other using bumps 5021 that are formed under the bottom surface of the controller chip 5020. The controller chip 5020 includes through-silicon Vias 5060 to reduce interfacing resistance between the base substrate 5010 and the controller chip 5020, compared with the wire bonding of FIG. 16. Bumps 5011 for electrical connection to an external device is formed under the bottom surface of the base substrate 5010.

The semiconductor memory chip 5100 and/or the controller chip 5020 include an ESD protection circuit as disclosed herein. The ESD protection circuit protects the internal circuits from ESD events that may occur through the bumps 5011 that are exposed.

Figure 18:
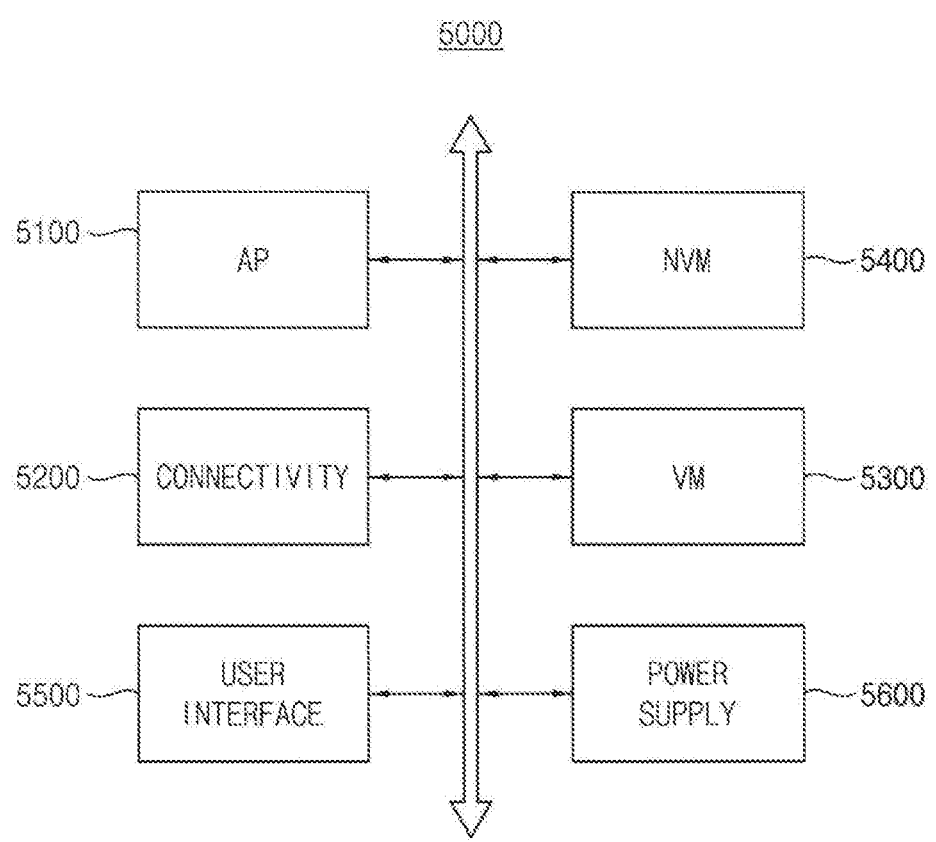
FIG. 18 is a block diagram illustrating a mobile device according to example embodiments.

FIG. 18 is a block diagram illustrating a mobile device according to example embodiments.

Referring to FIG. 18, a mobile device 5000 includes an application processor (AP) 5100, a connectivity interface 5200, a volatile memory device (VM) 5300, a nonvolatile memory device (NVM) 5400, a user interface 5500, and a power supply 5600. In some example embodiments, the mobile device 5000 may be an electronic device such as a mobile phone, a smart phone, a personal digital assistant (PDA), a portable multimedia player (PMP), a digital camera, a music player, a portable game console, a navigation system, or another type of electronic device.

The application processor 5100 may execute applications such as a web browser, a game application, a video player, etc. The connectivity interface 5200 may perform wired or wireless communication with an external device. The volatile memory device 5300 may store data processed by the application processor 5100 or may operate as a working memory. The nonvolatile memory device 5400 may store a boot image for booting the mobile device 5000. The user interface 5500 may include at least one input device, such as a keypad, a touch screen, etc., and at least one output device, such as a speaker, a display device, etc. The power supply 5600 may supply a power supply voltage to the mobile device 1400.

The mobile device 1400 may include at least one ESD protection circuit according to example embodiments as described above. The ESD protection circuit 1000 may include a transient-state detection circuit, a voltage detection circuit, a trigger circuit and a main discharge circuit. The transient-state detection circuit may generate a dynamic triggering signal based on a voltage change rate of a voltage on a first power rail. The voltage detection circuit may generate a static triggering signal based on the voltage on the first power rail. The trigger circuit may generate a discharge control signal based on the dynamic triggering signal and the static triggering signal. The main discharge circuit may discharge an electric charge from the first power rail to a second power rail based on the discharge control signal.

As such, the ESD protection circuit, the integrated circuit including the ESD protection circuit and the ESD protection method according to example embodiments may perform the discharging operation rapidly and protect the internal circuit stably even in case of an ESD event having a short rising time and a high peak current. In addition, a leakage current due to a false triggering may be prevented to reduce power consumption by performing the discharging operation only in the transient state.

Example embodiments may be applied to any devices and systems requiring ESD protection. For example, example embodiments may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

The foregoing is illustrative of example embodiments and is not to be construed as limiting thereof. Although a few example embodiments have been described, those skilled in the art will readily appreciate that many modifications are possible in the example embodiments without materially departing from the present disclosure.

What is claimed is:

1. An electrostatic discharge protection circuit (an ESD protection circuit) comprising:
 a transient-state detection circuit configured to generate a dynamic triggering signal based on a voltage change rate of a voltage on a first power rail configured to receive a power supply voltage;
 a voltage detection circuit configured to generate a static triggering signal at a static detection node based on the voltage on the first power rail, wherein the voltage detection circuit comprises a diode circuit connected between the first power rail and the static detection node, and a static detection resistor connected between the static detection node and a second power rail configured to receive a ground voltage, and wherein the diode circuit and the static detection resistor are connected to the transient-state detection circuit in parallel;
 a trigger circuit configured to generate a discharge control signal based on the dynamic triggering signal and the static triggering signal; and
 a main discharge circuit configured to discharge an electric charge from the first power rail to the second power rail based on the discharge control signal.

2. The ESD protection circuit of claim 1, wherein the trigger circuit is further configured to activate the discharge control signal when both of the dynamic triggering signal and the static triggering signal are activated, and
 wherein the main discharge circuit is further configured to discharge the electric charge from the first power rail to the second power rail in response to an activation of the discharge control signal.

3. The ESD protection circuit of claim 1, wherein the transient-state detection circuit is further configured to activate the dynamic triggering signal when the voltage change rate is higher than a reference rate.

4. The ESD protection circuit of claim 1, wherein the voltage detection circuit is further configured to activate the static triggering signal when the voltage is higher than a reference voltage.

5. The ESD protection circuit of claim 1, wherein the trigger circuit includes:
 a first trigger transistor connected between the first power rail and a first trigger node, the first trigger transistor having a first trigger transistor gate electrode configured to receive the dynamic triggering signal;

a second trigger transistor connected between the first trigger node and a second trigger node, the second trigger node providing the discharge control signal, and the second trigger transistor having a second trigger transistor gate electrode configured to receive the static triggering signal; and a trigger resistor connected between the second trigger node and the second power rail.

6. The ESD protection circuit of claim 5, wherein the first trigger transistor is a p-channel metal oxide semiconductor (PMOS) transistor and the second trigger transistor is an n-channel metal oxide semiconductor (NMOS) transistor.

7. The ESD protection circuit of claim 6, wherein the transient-state detection circuit includes:
a dynamic detection resistor connected between the first power rail and a dynamic detection node, the dynamic detection node providing the dynamic triggering signal; and
a dynamic detection capacitor connected between the dynamic detection node and the second power rail.

8. The ESD protection circuit of claim 7, wherein the first trigger transistor is configured to turn on when a voltage drop by a charging current flowing through the dynamic detection resistor is larger than a threshold voltage of the first trigger transistor.

9. The ESD protection circuit of claim 6, wherein the power supply voltage is higher than the ground voltage, and wherein the second trigger node is electrically connected to the main discharge circuit.

10. The ESD protection circuit of claim 5, wherein both of the first trigger transistor and the second trigger transistor are NMOS transistors.

11. The ESD protection circuit of claim 10, wherein the transient-state detection circuit includes:
a dynamic detection capacitor connected between the first power rail and a dynamic detection node, the dynamic detection node providing the dynamic triggering signal; and
a dynamic detection resistor connected between the dynamic detection node and the second power rail.

12. The ESD protection circuit of claim 5, wherein the second trigger transistor is configured to turn on when a current flows through the diode circuit.

13. The ESD protection circuit of claim 1, wherein the diode circuit includes a diode having an anode electrode connected to the first power rail and a cathode electrode connected to the static detection node.

14. The ESD protection circuit of claim 1, wherein the diode circuit includes a plurality of diodes forwardly connected in series between the first power rail and the static detection node.

15. The ESD protection circuit of claim 1, wherein the diode circuit includes a Zener diode having a cathode electrode connected to the first power rail and an anode electrode connected to the static detection node.

16. The ESD protection circuit of claim 5, wherein the main discharge circuit includes a discharge transistor connected between the first power rail and the second power rail, the discharge transistor having a discharge transistor gate electrode configured to receive the discharge control signal.

17. The ESD protection circuit of claim 16, further comprising an inverter connected between the second trigger node and the discharge transistor gate electrode.

18. An electrostatic discharge protection circuit (an ESD protection circuit) comprising:

a transient-state detection circuit connected between a first power rail configured to receive a power supply voltage and a second power rail configured to receive a ground voltage, the transient-state detection circuit being configured to activate a dynamic triggering signal when a voltage change rate of a voltage on the first power rail is higher than a reference rate;

a voltage detection circuit connected between the first power rail and the second power rail, the voltage detection circuit being configured to activate a static triggering signal at a static detection node when the voltage on the first power rail is higher than a reference voltage, wherein the voltage detection circuit comprises a diode circuit connected between the first power rail and the static detection node, and a static detection resistor connected between the static detection node and the second power rail, and wherein the diode circuit and the static detection resistor are connected to the transient-state detection circuit in parallel;

a trigger circuit connected between the first power rail and the second power rail, the trigger circuit being configured to activate a discharge control signal when both of the dynamic triggering signal and the static triggering signal are activated; and a main discharge circuit connected between the first power rail and the second power rail, the main discharge circuit being configured to discharge an electric charge from the first power rail to the second power rail in response to the discharge control signal being activated.

19. An integrated circuit comprising:
an internal circuit connected between a first power rail configured to provide a power supply voltage and a second power rail configured to provide a ground voltage; and
an electrostatic discharge protection circuit (an ESD protection circuit) connected between the first power rail and the second power rail, the ESD protection circuit being configured to discharge an electric charge from the first power rail to the second power rail based on a dynamic triggering signal and a static triggering signal,
wherein the ESD protection circuit comprises:
a transient-state detection circuit configured to generate the dynamic triggering signal based on a voltage change rate of a voltage on the first power rail; and
a voltage detection circuit configured to generate the static triggering signal based on the voltage on the first power rail, wherein the voltage detection circuit comprises a diode circuit connected in series with a static detection resistor between the first power rail and the second power rail, and
wherein the diode circuit and the static detection resistor are connected to the transient-state detection circuit in parallel.

20. The integrated circuit of claim 19, further comprising:
a first clamp diode, a first clamp diode anode electrode being connected to an input-output pad of the internal circuit and a first clamp diode cathode electrode being connected to the first power rail; and
a second clamp diode, a second clamp diode anode electrode being connected to the second power rail and a second clamp diode cathode electrode being connected to the input-output pad.

* * * * *